United States Patent
Wen et al.

(10) Patent No.: US 10,978,351 B2
(45) Date of Patent: Apr. 13, 2021

(54) ETCH STOP LAYER BETWEEN SUBSTRATE AND ISOLATION STRUCTURE

(71) Applicant: Taiwan Semiconductor Manufacturing Co., Ltd., Hsinchu (TW)

(72) Inventors: Ming-Chang Wen, Kaohsiung (TW); Chang-Yun Chang, Taipei (TW); Hsien-Chin Lin, Hsinchu (TW); Hung-Kai Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 39 days.

(21) Appl. No.: 15/816,155

(22) Filed: Nov. 17, 2017

(65) Prior Publication Data

US 2019/0157159 A1    May 23, 2019

(51) Int. Cl.
| | |
|---|---|
| *H01L 21/8234* | (2006.01) |
| *H01L 27/088* | (2006.01) |
| *H01L 29/06* | (2006.01) |
| *H01L 21/762* | (2006.01) |
| *H01L 29/66* | (2006.01) |
| *H01L 29/49* | (2006.01) |
| *H01L 29/51* | (2006.01) |

(52) U.S. Cl.
CPC .... *H01L 21/823481* (2013.01); *H01L 21/762* (2013.01); *H01L 21/76229* (2013.01); *H01L 21/823431* (2013.01); *H01L 27/0886* (2013.01); *H01L 29/0649* (2013.01); *H01L 29/4966* (2013.01); *H01L 29/517* (2013.01); *H01L 29/66545* (2013.01)

(58) Field of Classification Search
None
See application file for complete search history.

(56) References Cited

U.S. PATENT DOCUMENTS

| | | |
|---|---|---|
| 8,319,311 B2 | 11/2012 | Chen et al. |
| 8,772,109 B2 | 7/2014 | Colinge |
| 8,785,285 B2 | 7/2014 | Tsai et al. |
| 8,816,444 B2 | 8/2014 | Warn et al. |

(Continued)

FOREIGN PATENT DOCUMENTS

| | | |
|---|---|---|
| CN | 106328503 A | 1/2017 |
| CN | 107039526 A | 8/2017 |

(Continued)

OTHER PUBLICATIONS

Drawings of Basker US 2017-0140995, May 18, 2017.*

(Continued)

*Primary Examiner* — Davienne N Monbleau
*Assistant Examiner* — Scott R Wilson
(74) *Attorney, Agent, or Firm* — Haynes and Boone, LLP

(57) ABSTRACT

A device that includes a substrate; semiconductor fins extending from the substrate; an isolation structure over the substrate and laterally between the semiconductor fins; a liner layer between sidewalls of the semiconductor fins and the isolation structure; and an etch stop layer between the substrate and the isolation structure and laterally between the semiconductor fins. The etch stop layer includes a material different than that of the isolation structure and the liner layer.

20 Claims, 10 Drawing Sheets

(56) References Cited

U.S. PATENT DOCUMENTS

| | | | |
|---|---|---|---|
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,236,379 B2 | 1/2016 | Tsai et al. | |
| 9,287,382 B1 | 3/2016 | Lee et al. | |
| 9,508,791 B2 | 11/2016 | Tsai et al. | |
| 9,520,482 B1* | 12/2016 | Chang | H01L 27/0924 |
| 9,576,814 B2 | 2/2017 | Wu et al. | |
| 10,083,874 B1* | 9/2018 | Yu | H01L 21/3065 |
| 2014/0353795 A1* | 12/2014 | Tong | H01L 21/76224 |
| | | | 257/506 |
| 2015/0214331 A1* | 7/2015 | Jang | H01L 29/51 |
| | | | 438/164 |
| 2015/0349069 A1* | 12/2015 | Xie | H01L 29/517 |
| | | | 257/401 |
| 2016/0056290 A1 | 2/2016 | Tsai et al. | |
| 2016/0126131 A1* | 5/2016 | Collaert | H01L 21/76224 |
| | | | 257/618 |
| 2016/0308112 A1* | 10/2016 | Tan | H01L 41/47 |
| 2016/0351568 A1* | 12/2016 | Chang | H01L 27/0924 |
| 2016/0372364 A1* | 12/2016 | Goktepeli | H01L 21/78 |
| 2017/0140995 A1* | 5/2017 | Basker | H01L 29/0649 |
| 2017/0186758 A1 | 6/2017 | Lee et al. | |
| 2019/0115452 A1* | 4/2019 | Cheng | H01L 21/823487 |
| 2019/0296011 A1* | 9/2019 | Guo | H01L 21/82343 |

FOREIGN PATENT DOCUMENTS

| | | |
|---|---|---|
| TW | 201017772 | 5/2010 |
| TW | 201626445 | 7/2016 |
| TW | 201637127 | 10/2016 |
| TW | 201711092 | 3/2017 |

OTHER PUBLICATIONS

Kastenmeier, B. E. E. et al., "Highly selective etching of silicon nitride over silicon and silicon dioxide," J. Vac. Sci. Technol. A 17(6), Nov./Dec. 1999, pp. 3179-3184.

Reyes-Betanzo, C. et al., "Plasma Etching of Silicon Nitride with High Selectivity over Silicon Oxide and Silicon in Flourine Containing Plasmas", Center for Semiconductor Components—CCS, UNICAMP, C.P. 6061, CEP 13083-970, Campinas, SP, Brazil, publication date unknown, downloaded from the Internet Nov. 17, 2017, 2 pages.

* cited by examiner

ETCH STOP LAYER BETWEEN SUBSTRATE AND ISOLATION STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the replacement of the typically polysilicon gate with a metal gate to improve device performance with the decreased feature sizes. One process of forming a metal gate is termed a replacement gate or "gate-last" process in which the metal gate is fabricated "last" which allows for reduced number of subsequent processes, including high temperature processing, that must be performed after formation of the gate. However, there are challenges to implementing such IC fabrication processes. In one example, after the metal gate replaces the polysilicon gate, the metal gate is etched (or cut) for individual transistors. This etching process may sometimes etch into the substrate, introducing defects into the devices. Accordingly, improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
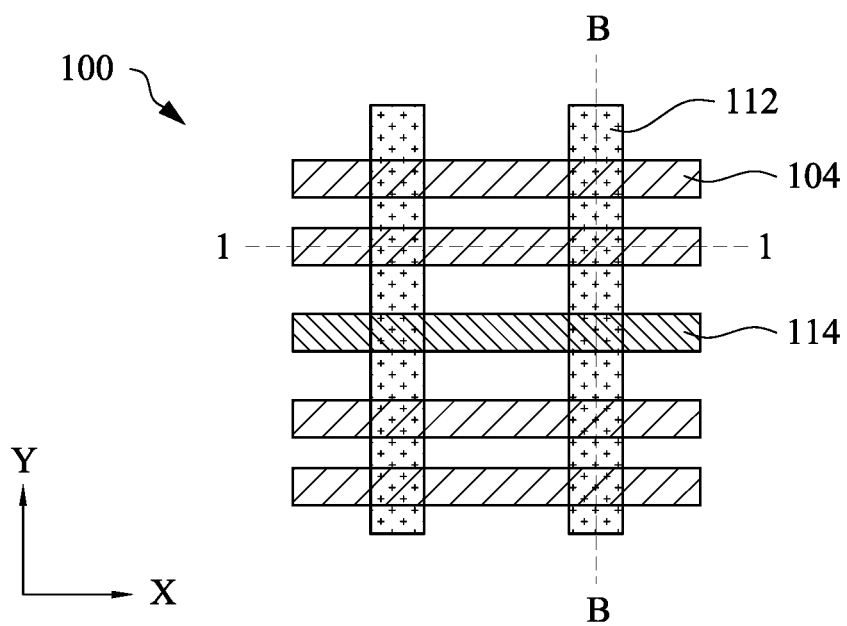
FIG. 1A shows a top view of a semiconductor structure implemented with a cut metal gate process, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating FinFET devices using a cut metal gate process. A cut metal gate process refers to a fabrication process where after a metal gate (e.g., a high-k metal gate or HK MG) replaces a dummy gate structure (e.g., a polysilicon gate), the metal gate is cut by an etching process to separate the metal gate into two or more portions. Each portion functions as a metal gate for an individual FinFET transistor. To ensure complete separation between the two or more portions, the etching process generally performs some over-etching that not only etches through the metal gate but also etches an isolation structure under the metal gate. In some cases, the over-etching might accidentally etch through the isolation structure and etch into a semiconductor substrate under the isolation structure. This might cause circuit defects. An object of the present disclosure is to prevent the over-etching from etching into the semiconductor substrate by providing an etch stop layer between the semiconductor substrate and the isolation structure.

Figure 1B:
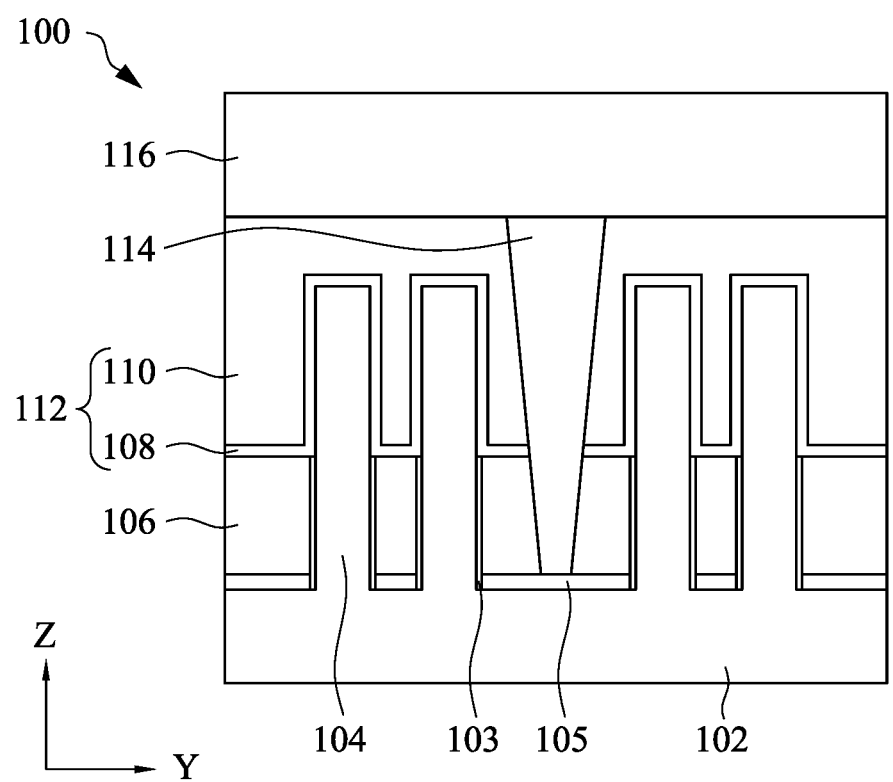
FIG. 1B shows a cross-sectional view of the semiconductor structure in FIG. 1A, in accordance with an embodiment.

FIG. 1A illustrates a top view of a semiconductor device 100 (or semiconductor structure) 100. FIG. 1B illustrates a cross-sectional view of the device 100 along the B-B line of FIG. 1A. Referring to FIGS. 1A and 1B collectively, the device 100 includes a substrate 102, a plurality of fins 104 protruding out of the substrate 102, an isolation structure 106 over the substrate 102 and between the fins 104, and a plurality of gate stacks (or gate structures) 112 disposed over the fins 104 and the isolation structure 106. Each gate stack 112 includes a high-k dielectric layer 108, and a conductive layer 110 over the high-k dielectric layer 108. The conductive layer 110 includes one or more layers of metallic materials. Therefore, each gate stack 112 is also referred to as a high-k metal gate (or HK MG) 112. The gate stacks 112 may further include an interfacial layer (not shown) under the high-k dielectric layer 108. The device 100 further includes a dielectric liner layer 103 on sidewalls of the fins 104, and an etch stop layer 105 disposed on a top surface of the substrate 102 and below the isolation structure 106. The etch stop layer 105 includes a material different from that of the isolation structure 106.

From the top view (FIG. 1A), the fins 104 are arranged lengthwise along the X direction, and the gate stacks 112 are arranged lengthwise along the Y direction which is generally perpendicular to the X direction. Further, the fins 104 are generally parallel to each other, and the gate stack 112 are generally parallel to each other. The device 100 further includes a dielectric layer 114 that is arranged lengthwise along the X direction and separates each piece of the gate stacks 112 into at least two portions. Each portion of the gate stacks 112 engages the respective fins 104 to form individual FinFET transistors. In the present embodiment, the dielectric layer 114 extends through the isolation structure 106 and physically contacts the etch stop layer 105. In alternative embodiments, the dielectric layer 114 does not completely extend through the isolation structure 106 and does not physically contact the etch stop layer 105. The device 100 further includes one or more dielectric layers 116 disposed over the gate stacks 112 and the dielectric layer 114. The components of the device 100 are further described below.

The substrate 102 is a silicon substrate in the present embodiment. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the substrate 102 includes indium tin oxide (ITO) glass.

The fins 104 may comprise one or more semiconductor materials such as silicon, germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, and gallium indium arsenide phosphide. In an embodiment, the fins 104 may include alternately stacked layers of two different semiconductor materials, such as layers of silicon and silicon germanium alternately stacked. The fins 104 may additionally include dopants for improving the performance of the device 100. For example, the fins 104 may include n-type dopant(s) such as phosphorus or arsenic, or p-type dopant(s) such as boron or indium.

The liner layer 103 may include silicon nitride (e.g., $Si_3N_4$), and may be deposited using chemical vapor deposition (CVD) such as low-pressure CVD (LPCVD) or plasma-enhanced CVD (PECVD), atomic layer deposition (ALD), or other suitable methods. The liner layer 103 may have a thickness of about 1 nm to about 5 nm and is substantially conformal on the sidewalls of the fins 104.

In an embodiment, the etch stop layer 105 includes a dielectric material that is different from that of the isolation structure 106. For example, the etch stop layer 105 may include alumina ($Al_2O_3$), tungsten carbide (WC), or yttrium silicon oxide ($YSiO_x$). To further this embodiment, the etch stop layer 105 may be deposited using physical vapor deposition (PVD), CVD, ALD, or other suitable methods, and may have a thickness of about 1 nm to about 5 nm. In one specific example, the etch stop layer 105 includes conformal ALD $Al_2O_3$.

In another embodiment, the etch stop layer 105 includes silicon and one of following: carbon, germanium, a group III element, and a group V element. For example, the etch stop layer 105 may include silicon and one of: carbon, germanium, arsenic, and phosphorus. In an embodiment, the etch stop layer 105 includes silicon carbide, silicon germanium, silicon arsenide, silicon phosphide, or a combination thereof. To further this embodiment, the etch stop layer 105 may be formed by CVD, PVD, or an epitaxial growth process. In an alternative embodiment, the etch stop layer 105 includes silicon implanted with phosphorous. In yet another embodiment, the etch stop layer 105 includes an III-V compound, such as gallium arsenide, gallium phosphide, gallium nitride, and indium arsenide. The selection of the material for the etch stop layer 105 may be based on the etchant chemistry used for etching the high-k metal gate 112, which will be discussed later. The etch stop layer 105 may have a thickness of about 1 nm to about 5 nm.

The isolation structure 106 may comprise silicon oxide, silicon nitride, silicon oxynitride, fluoride-doped silicate glass (FSG), a low-k dielectric material, and/or other suitable insulating material. The isolation structure 106 may be shallow trench isolation (STI) features. The isolation structure 106 may be deposited using CVD such as flowable CVD, or other suitable methods.

The high-k dielectric layer 108 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 108 may be deposited using CVD, ALD and/or other suitable methods.

The conductive layer 110 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. The conductive layer 110 may be deposited using methods such as CVD, PVD, plating, and/or other suitable processes.

The dielectric layer 114 may include one or more dielectric materials, such as silicon nitride, silicon oxide, silicon oxynitride, fluoride-doped silicate glass (FSG), a low-k dielectric material, and/or other suitable insulating material. Particularly, the portion of the dielectric layer 114 in physical contact with the gate stacks 112 includes a dielectric material that does not react with the metal materials of the gate stack 112. For example, that portion of the dielectric layer 114 includes silicon nitride in an embodiment. The dielectric layer 114 may be deposited using CVD, PVD, ALD, or other suitable methods.

The dielectric layer 116 may include one or more dielectric materials, such as silicon nitride, silicon oxide, silicon oxynitride, fluoride-doped silicate glass (FSG), a low-k dielectric material, and/or other suitable insulating material. The dielectric layer 116 may be deposited using CVD, PVD, or other suitable methods.

Figure 2A:
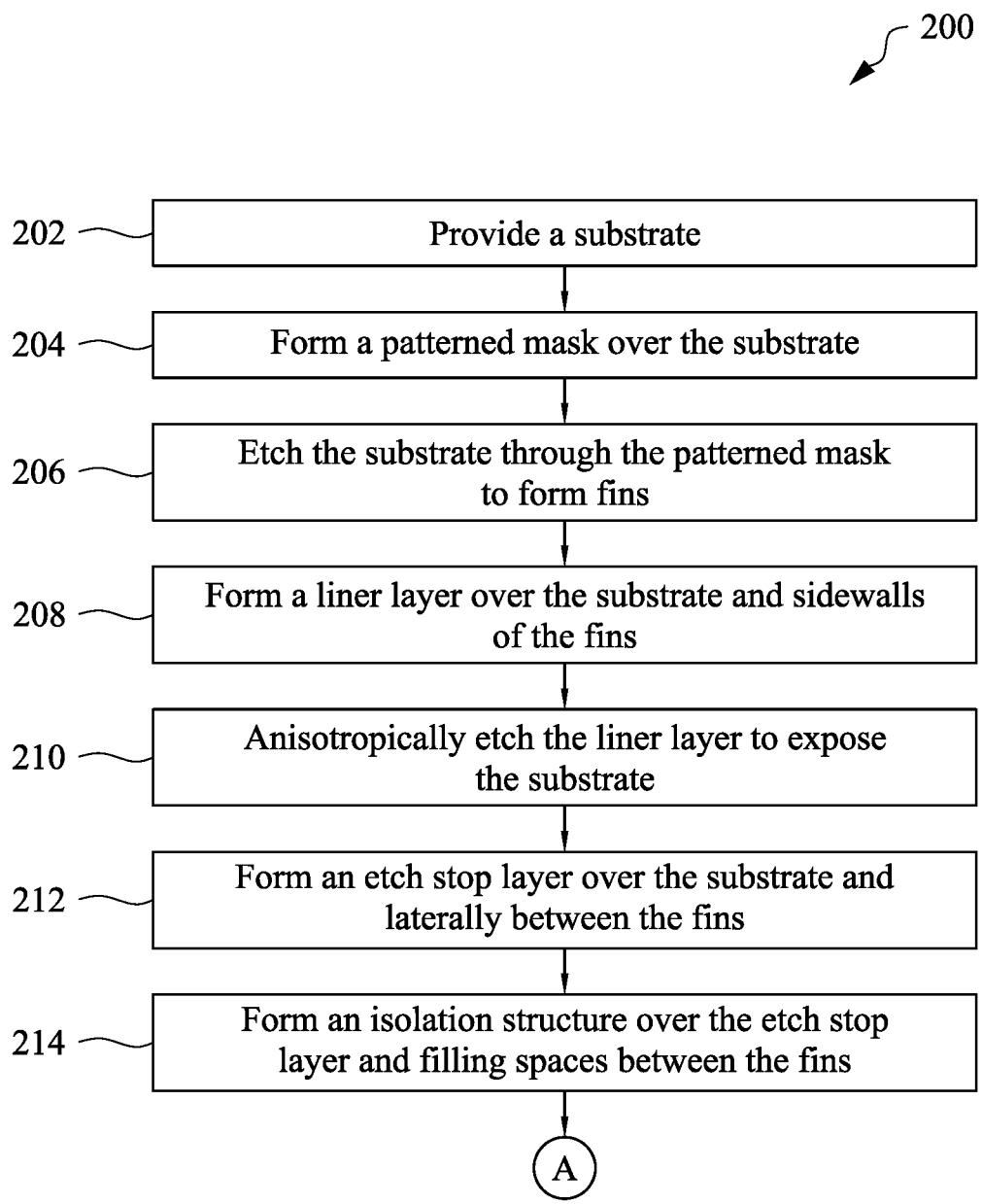
FIGS. 2A and 2B show a flow chart of a method for forming the semiconductor structure shown in FIGS. 1A-1B, according to aspects of the present disclosure.
Figure 2B:
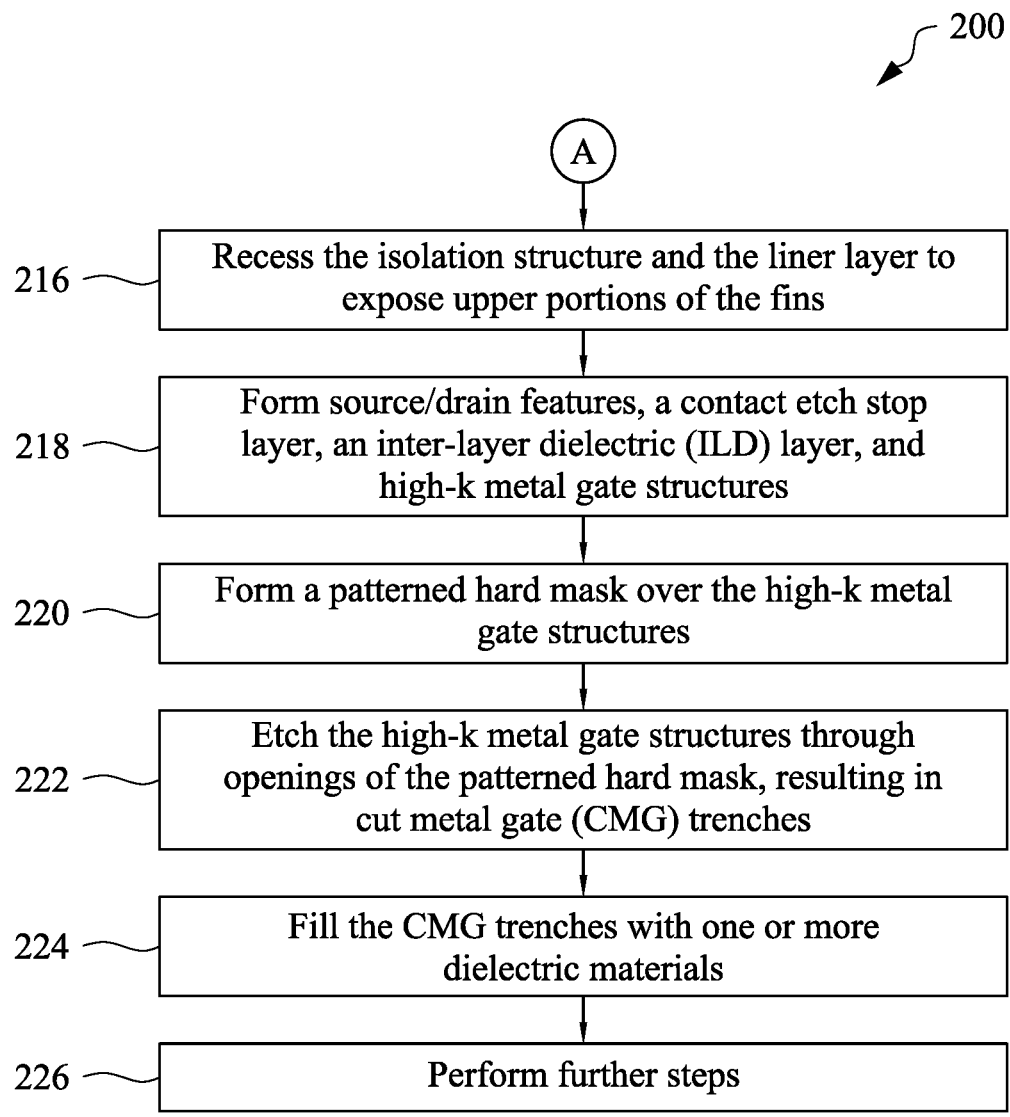

FIGS. 2A and 2B illustrate a flow chart of a method 200 for forming the semiconductor device 100 in accordance with an embodiment. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-13, which illustrate various cross-sectional views of the semiconductor device 100 during fabrication steps according to the method 200.

Figure 3:
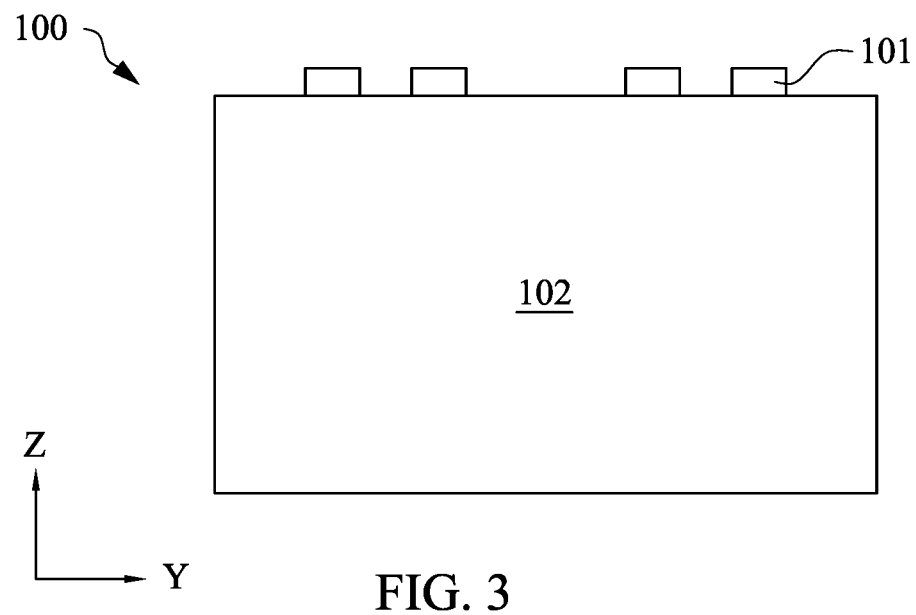
FIGS. 3, 4, 5, 6, 7, 8, 9, 10A, 10B, 11, 12, and 13 illustrate cross-sectional views of a semiconductor structure during a fabrication process according to the method of FIGS. 2A-2B, in accordance with an embodiment.

At operation 202, the method 200 (FIG. 2A) provides, or is provided with, a device structure 100 having a substrate 102, such as shown in FIG. 3. The various materials for the substrate 102 have been discussed above with reference to FIGS. 1A-1B. In an embodiment, the substrate 102 may be a wafer, such as a silicon wafer, and may include one or more epitaxially grown semiconductor layers in its upper portion.

At operation 204, the method 200 (FIG. 2A) forms a patterned mask 101 over the substrate 102, such as shown in FIG. 3. The patterned mask 101 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, become the patterned mask 101. The patterned mask 101 may include silicon oxide, silicon nitride, photoresist, or other suitable materials in various embodiments.

Figure 4:
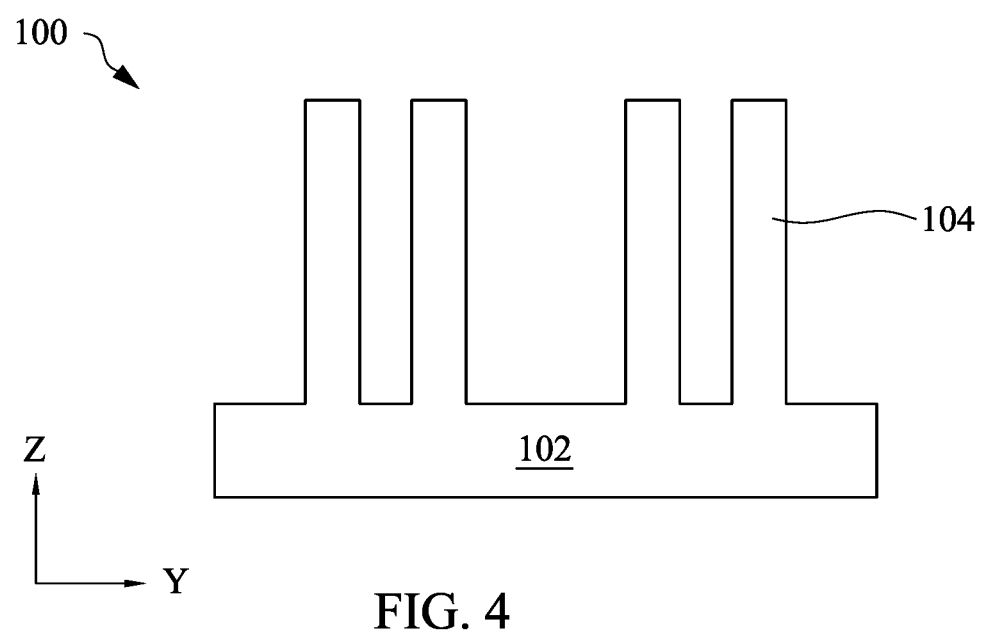

At operation 206, the method 200 (FIG. 2A) etches the substrate 102 using the patterned mask 101 as an etch mask, thereby forming the fins 104, such as shown in FIG. 4. The patterned mask 101 is removed thereafter. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Figure 5:
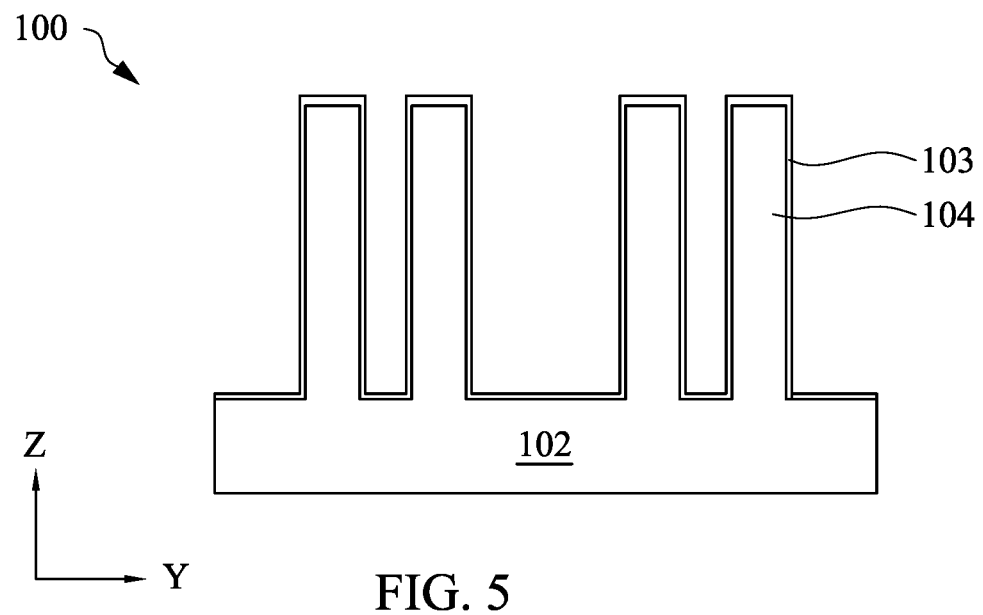

At operation 208, the method 200 (FIG. 2A) forms a liner layer 103 over sidewalls of the fins 104. In the present embodiment, the liner layer 103 is deposited over top and sidewalls of the fins 104 and over a top surface of the substrate 102, such as shown in FIG. 5. To further the present embodiment, the liner layer 103 includes silicon nitride (e.g., $Si_3N_4$), and may be deposited using LPCVD, PECVD, ALD, or other suitable methods. The liner layer 103 may be deposited to a thickness of 1 to 5 nm, such as 3 nm.

Figure 6:
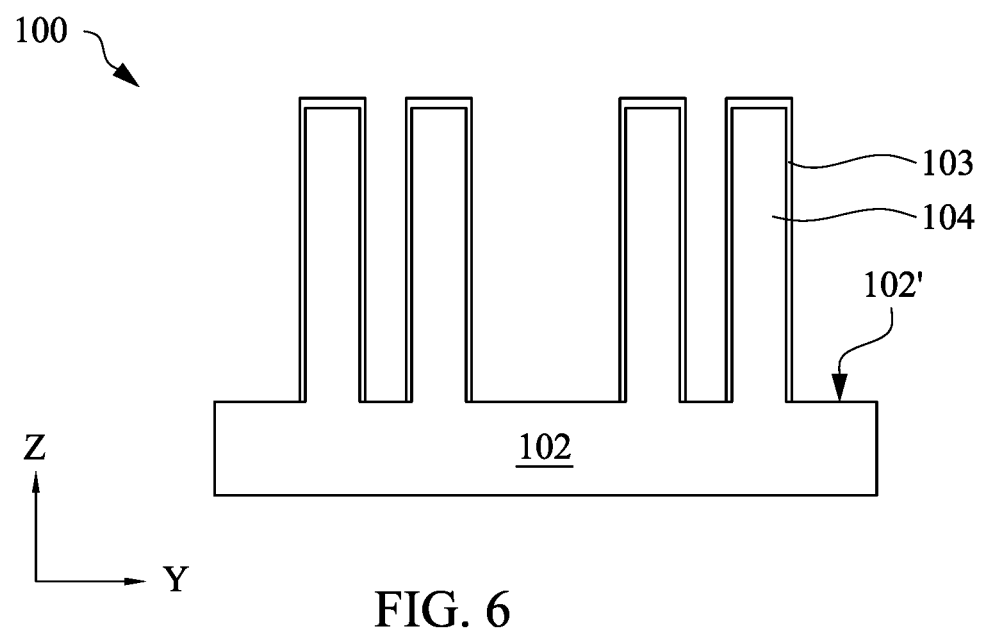

At operation 210, the method 200 (FIG. 2A) applies an anisotropic etching process to the liner layer 103. The anisotropic etching process is designed to selectively etch the liner layer 103 but does not etch the substrate 102. Referring to FIG. 6, the operation 210 removes portions of the liner layer 103 from the top surface 102' of the substrate 102, thereby exposing the top surface 102'. The portion of the liner layer 103 on the sidewalls of the fins 104 remains substantially un-etched due to the highly directional etching. Further, the top surface of the fins 104 may or may not be exposed by this anisotropic etching process. In an embodiment where the liner layer 103 includes silicon nitride, the operation 210 may employ a remote $O_2/N_2$ discharge with a fluorine-containing gas such as $CF_4$, $NF_3$, or $SF_6$, and may additionally include hydrogen ($H_2$) or $CH_4$. Various other methods of selectively etching the liner layer 103 are possible.

Figure 7:
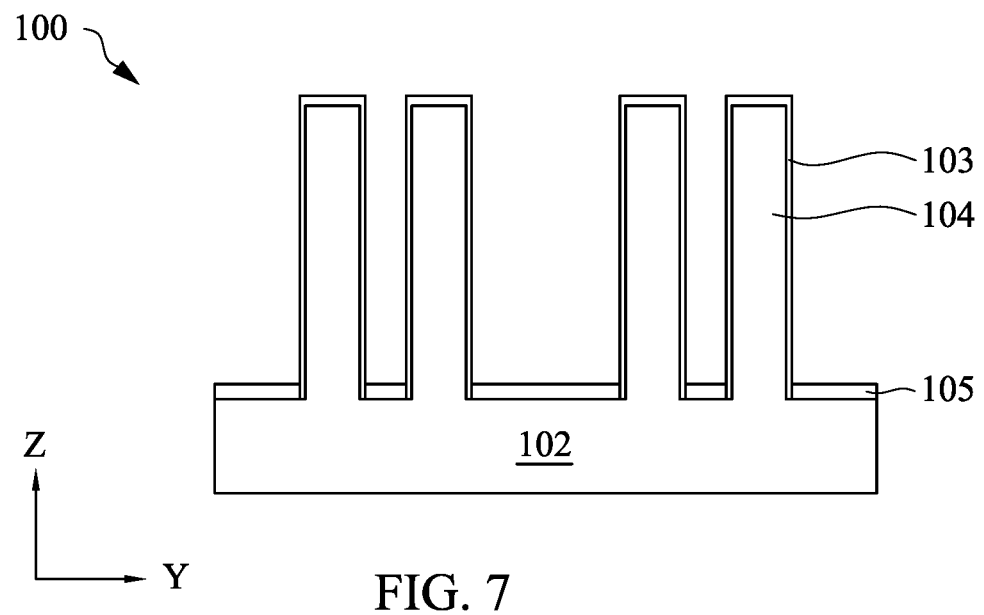

At operation 212, the method 200 (FIG. 2A) forms an etch stop layer 105 over the substrate 102. Referring to FIG. 7, the etch stop layer 105 is disposed on the substrate 102 and laterally between the fins 104. In an embodiment, the etch stop layer 105 includes a dielectric material such as $Al_2O_3$, WC, or $YSiO_x$, and is deposited using PVD, CVD, ALD, or other suitable methods as a conformal layer. To further this embodiment, the etch stop layer 105 may be deposited to a thickness of about 1 nm to about 5 nm. If it is thinner than about 1 nm, the etch stop layer 105 may not provide enough etching stop function. If it is thicker than about 5 nm, the etch stop layer 105 may cause concerns with well to well isolation and junction leakage.

In another embodiment, the etch stop layer 105 includes silicon germanium and may be formed by epitaxially growing silicon germanium over the top surface 102' (FIG. 6) of the substrate 102. The epitaxial growth process may be a cyclic deposition and etching (CDE) process, a co-flow epitaxy deposition process, a low pressure chemical vapor deposition (LPCVD) process, a selective epitaxy growth (SEG) process, or other suitable processes. For example, the etch stop layer 105 having silicon germanium may be formed by a CDE epitaxial growth process that use HCl as the etching gas and a precursor having $H_2$, a silicon-containing chemical (such as $SiH_4$), and a germanium-containing chemical ($GeH_4$) as the deposition gas. To further this embodiment, the etch stop layer 105 may be deposited to a thickness of about 1 nm to about 5 nm. If it is thinner than about 1 nm, the etch stop layer 105 may not provide enough etching stop function. If it is thicker than about 5 nm, the etch stop layer 105 may cause concerns with well to well isolation and junction leakage.

In another embodiment, the etch stop layer 105 includes silicon arsenide or silicon phosphide, and may be formed by a suitable epitaxial growth process. In yet another embodiment, the etch stop layer 105 includes epitaxially grown silicon implanted with phosphorous or boron ions. For example, the etch stop layer 105 may have a phosphorous concentration ranging from about $1E15$ $cm^{-3}$ to about $1E21$ $cm^{-3}$, or a boron concentration ranging from about $1E15$ $cm^{-3}$ to about $1E21$ $cm^{-3}$. In various embodiments, the etch stop layer 105 may include other materials as discussed above with reference to FIG. 1B.

Figure 8:
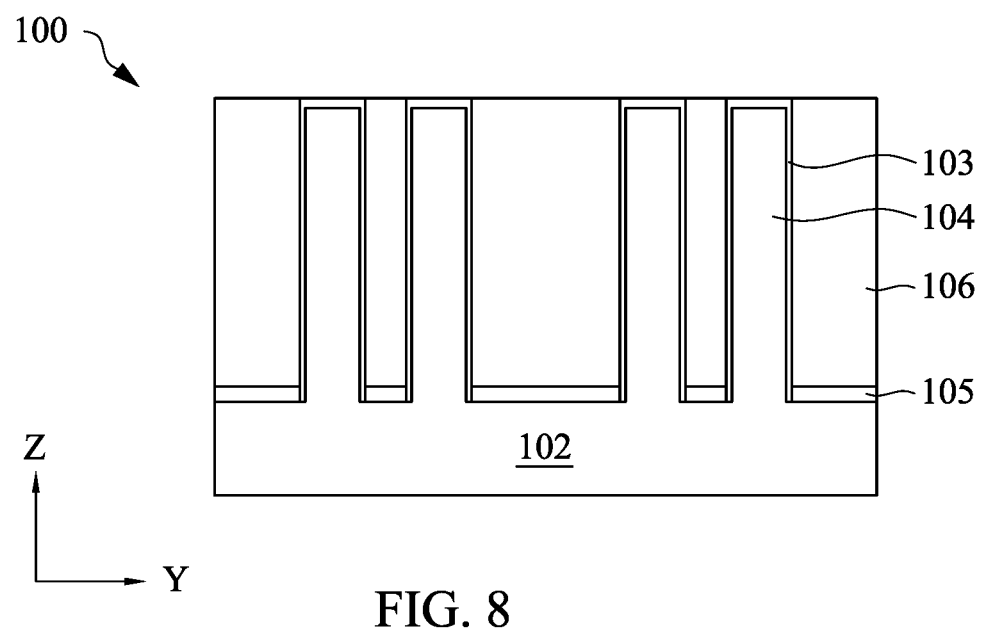

At operation 214, the method 200 (FIG. 2A) forms an isolation structure 106 over the etch stop layer 105 and filling spaces between the fins 104, such as shown in FIG. 8. The operation 214 may include a variety of processes such as deposition (e.g., FCVD), annealing, chemical mechanical planarization (CMP), and etching back. For example, the operation 214 may deposit a flowable dielectric material over the substrate 102 and filling the gaps between the fins 104. In some embodiments, the deposition of the flowable dielectric material includes introducing a silicon-containing compound and an oxygen-containing compound that react to form a flowable dielectric material, thereby filling the gaps. The material for the isolation structure 106 may include undoped silicate glass (USG), fluoride-doped silicate glass (FSG), phosphosilicate glass (PSG), borophosphosilicate glass (BPSG), or other suitable insulating material. Subsequently, the operation 214 treats the flowable material with some annealing processes to convert the flowable dielectric material into a solid dielectric material. The annealing processes may include dry annealing or wet annealing with a temperature ranging from 400 to 550° C. Thereafter, the operation 214 performs one or more CMP processes and/or etching back processes to recess the isolation structure 106.

Figure 9:
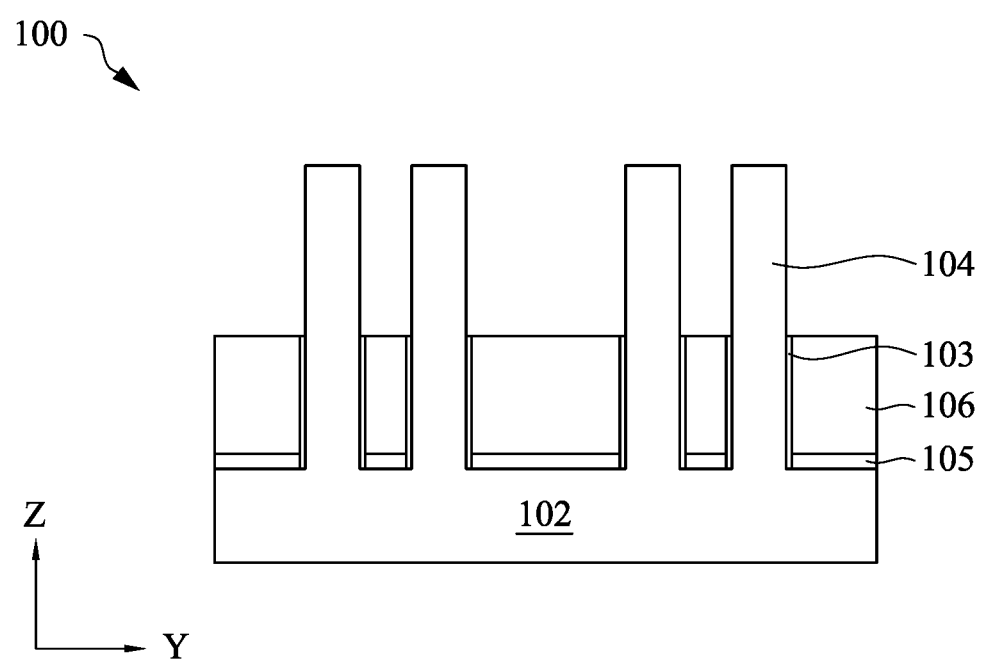

At operation 216, the method 200 (FIG. 2B) recesses the isolation structure 106 and the liner layer 103 to expose upper portions of the fins 104, such as shown in FIG. 9. The operation 216 may employ one or more wet etching, dry etching, reactive ion etching, or other suitable etching methods in various embodiments.

Figure 10A:
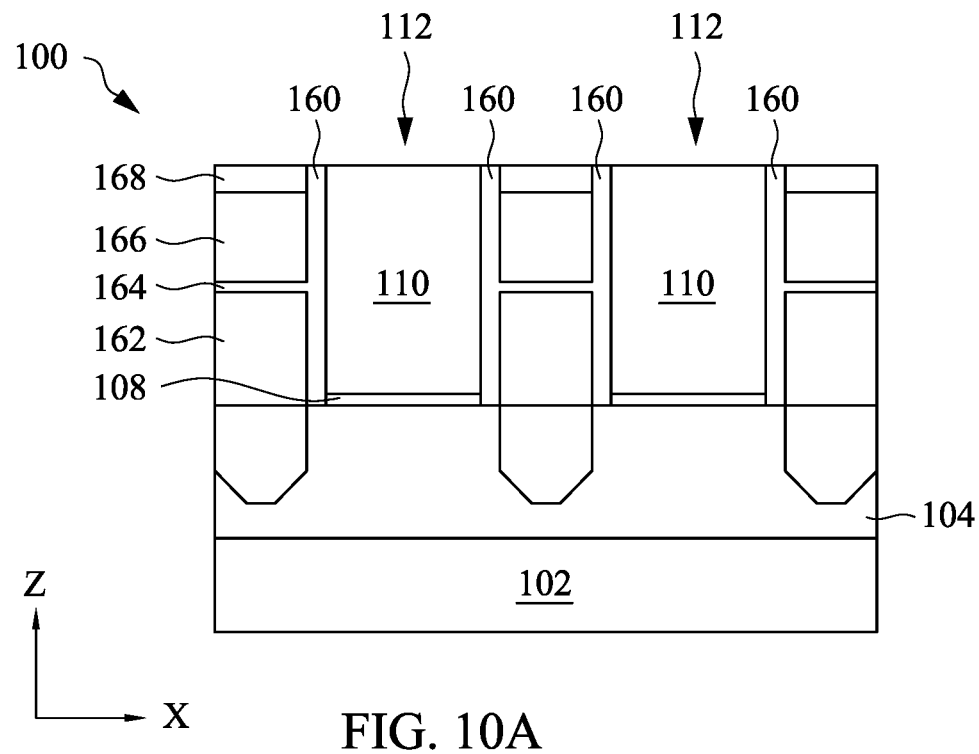
Figure 10B:
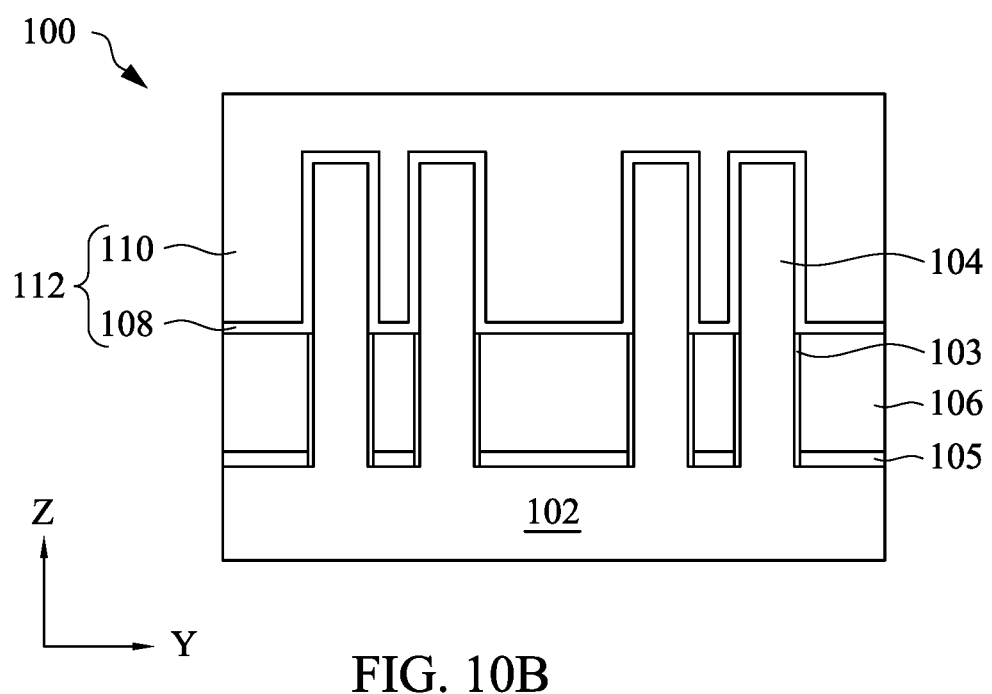

At operation 218, the method 200 (FIG. 2B) forms various features in or over the fins 104, including gate spacers 160, source/drain (S/D) features 162, a contact etch stop layer (CESL) 164, an interlayer dielectric (ILD) layer 166, a protective layer 168, and high-k metal gate stacks 112 having a high-k gate dielectric layer 108 and a conductive layer 110, such as shown in FIGS. 10A and 10B. FIG. 10A is a cross-sectional view of the device 100 cut along the length of the fins 104 (the "1-1" line of FIG. 1A), and FIG. 10B is a cross-sectional view of the device 100 cut along the width of the fins 104 (the "B-B" line of FIG. 1A). The operation 218 includes a variety of processes. In a particular embodiment, the operation 218 includes a replacement gate process which will be discussed below.

In the replacement gate process, the operation 218 begins by forming temporary gate structures (not shown) over the isolation structure 106 and engaging the fins 104. The temporary gate structures may include a dummy interfacial layer having silicon oxide or silicon oxynitride, and a dummy electrode layer having polysilicon. The temporary gate structures may be formed by deposition and etching processes.

Thereafter, the operation 218 forms the gate spacers 160 on sidewalls of the temporary gate structures. The gate spacers 160 may comprise a dielectric material, such as silicon oxide, silicon nitride, silicon oxynitride, silicon carbide, other dielectric material, or combinations thereof, and may comprise one or multiple layers of material. The gate spacers 160 may be formed by depositing a spacer material as a blanket over the isolation structure 106, the fins 104, and the dummy gate structures (not shown). Then the spacer material is etched by an anisotropic etching process. Portions of the spacer material on the sidewalls of the dummy gate structures remain and become the gate spacers 160.

Then, the operation 218 forms the S/D features 162 over the fins 104, the CESL 164 over the S/D features 162, the ILD layer 166 over the CESL 164, and the protective dielectric layer 168 over the ILD layer 166, such as shown in FIG. 10A. For example, the operation 218 may etch recesses into the fins 104 adjacent to the gate spacer 160, and epitaxially grow semiconductor materials in the recesses. The semiconductor materials may be raised above the top surface of the fins 104. The operations 218 may form the S/D features 162 separately for NFET and PFET devices. For example, the operations 218 may form the S/D features 162 with n-type doped silicon for NFET devices or p-type doped silicon germanium for PFET devices. Thereafter, the operation 218 may deposit the CESL 164 and the ILD layer 166 over the S/D features 162. The CESL 164 may comprise silicon nitride, silicon oxynitride, silicon nitride with oxygen (O) or carbon (C) elements, and/or other materials; and may be formed by CVD, PVD, ALD, or other suitable methods.

The ILD layer 166 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD, FCVD, or other suitable methods. Subsequently, the operation 218 may etch back the ILD layer 166 and deposit the protective dielectric layer 168 which may comprise a nitride such as silicon nitride for protecting the ILD layer 166 during subsequent etching processes. The operation 218 performs one or more CMP processes to planarize the top surface of the device 100.

Subsequently, the operation 218 removes the dummy gate structures to form gate trenches (not shown) between the gate spacers 160 and deposits high-k metal gate stacks 112 in the gate trenches. The high-k metal gate stacks 112 include the high-k dielectric layer 108 and the conductive layer 110. The high-k metal gate stacks 112 may further include an interfacial layer (e.g., silicon dioxide or silicon oxynitride) (not shown) between the high-k dielectric layer 108 and the fins 104. The interfacial layer may be formed using chemical oxidation, thermal oxidation, ALD, CVD, and/or other suitable methods. The materials of the high-k dielectric layer 108 and the conductive layer 110 have been discussed above with reference to FIGS. 1A-1B. The high-k dielectric layer 108 may include one or more layers of high-k dielectric material, and may be deposited using CVD, ALD, and/or other suitable methods. The conductive layer 110 may include one or more work function metal layers and a metal fill layer, and may be deposited using methods such as CVD, PVD, plating, and/or other suitable processes.

Figure 11:
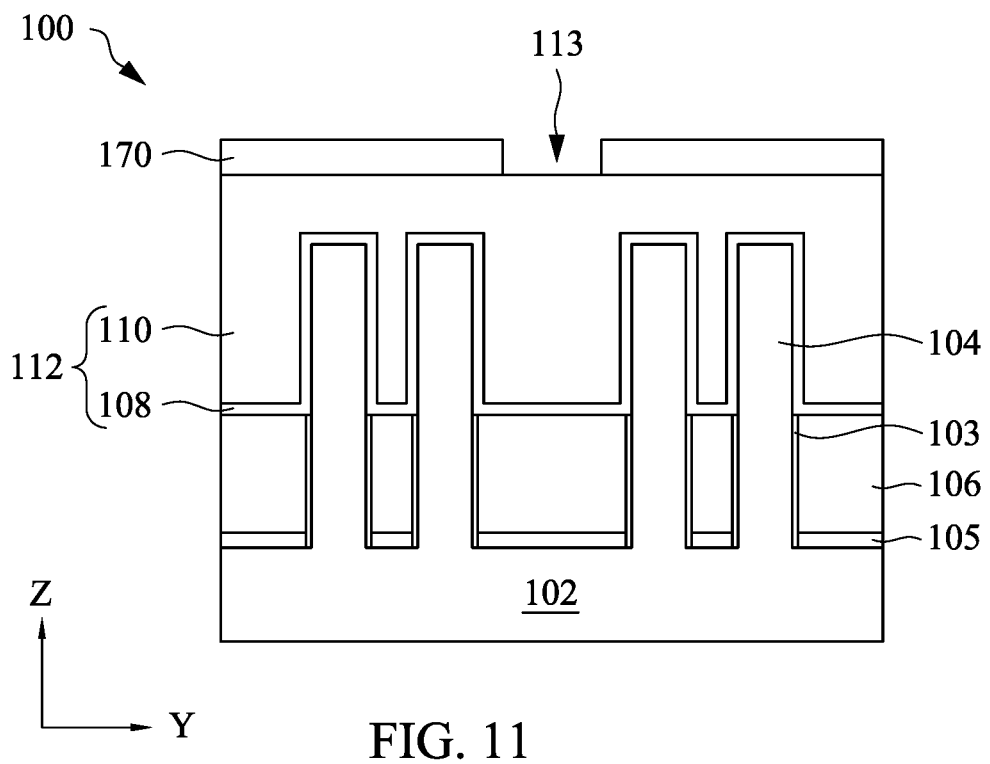

At operation 220, the method 200 (FIG. 2B) forms a hard mask layer 170 over the device 100 and patterns the hard mask layer 170 to provide an opening 113, such as shown in FIG. 11 which is a cross-sectional view of the device 100 along the B-B line of FIG. 1A at this fabrication stage. The hard mask layer 170 includes titanium nitride, silicon nitride, amorphous silicon, a combination thereof, or other suitable materials. The opening 113 exposes a portion of the high-k metal gate 112. From the top view, the opening 113 corresponds to the shape of the dielectric feature 114 in FIG. 1A. The hard mask layer 170 may be deposited using CVD, PVD, ALD, or other suitable methods. The operation 220 may use photolithography and etching processes to pattern the hard mask layer 170. For example, the operation 220 may form a patterned photoresist over the hard mask layer 170 by photoresist coating, exposing, post-exposure baking, and developing. Then, the operation 220 etches the hard mask layer 170 using the patterned photoresist as an etch mask to form the opening 113. The etching process may include wet etching, dry etching, reactive ion etching, or other suitable etching methods. The patterned photoresist is removed thereafter, for example, by resist stripping.

Figure 12:
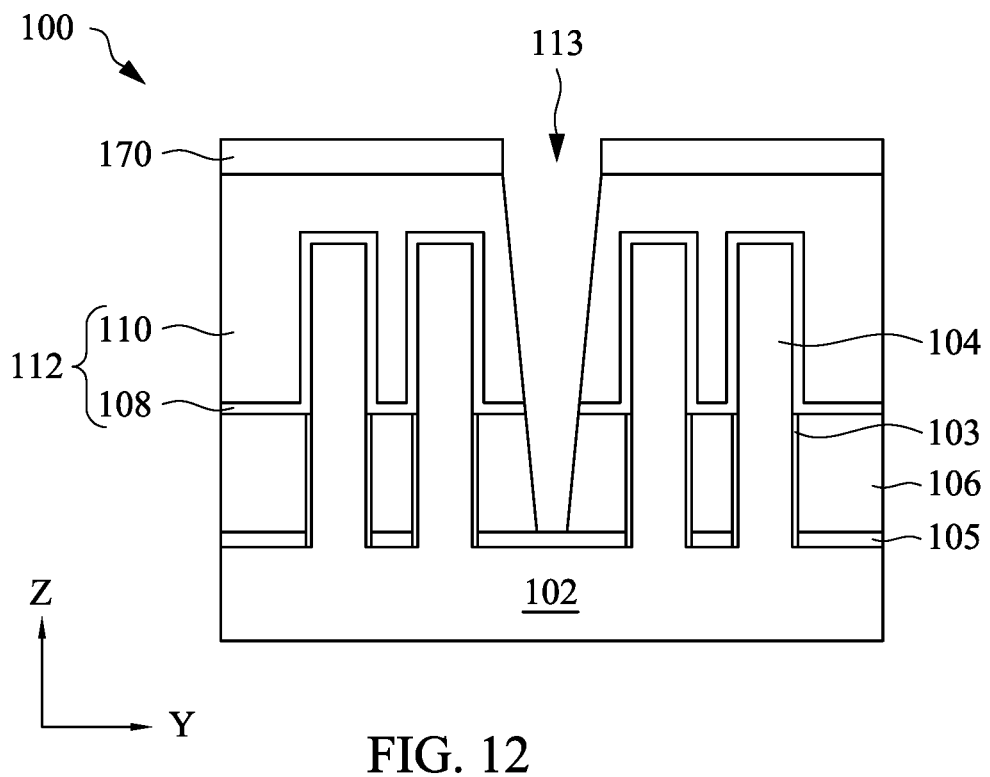

At operation 222, the method 200 (FIG. 2B) etches the high-k metal gate stack 112 through the opening 113. To ensure that the high-k metal gate stack 112 is completely etched through, the operation 222 performs over-etching, thereby extending the opening 113 into the isolation structure 106, such as shown in FIG. 12. Since the opening 113 is a trench formed by cutting a high-k metal gate stack, it is also referred to as a cut-metal-gate (CMG) trench in the present disclosure. The patterned hard mask layer 170 protects the rest of the high-k metal gate stack 112 from the etching process.

The etching process may use one or more etchants or a mixture of etchants that etch the various layers in the high-k metal gate stack 112. In an exemplary embodiment, the conductive layer 110 includes titanium silicon nitride (TiSiN), tantalum nitride (TaN), titanium nitride (TiN), tungsten (W), or a combination thereof. To etch such a conductive layer and the high-k dielectric layer 108, the operation 222 may apply a dry etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. In one example, the etchant includes a gas mixture of $Cl_2$, $O_2$, $CF_4$, $BCl_3$, and $CHF_3$. These types of etchants typically do not have good etch selectivity between the high-k metal gate stack 112 and the isolation structure 106. Therefore, there is a risk that the etching process may penetrate the isolation structure 106. In fabrication methods that do not provide the etch stop layer 105, if the isolation structure 106 is etched through, the substrate 102 will also be etched, introducing circuit defects therein.

In the present embodiment, the etch stop layer 105 resists the etching process of the operation 222. So, even if the isolation structure 106 is penetrated (such as shown in FIG. 12), the etching process does not penetrate the etch stop layer 105 and does not etch the substrate 102. In various embodiments, the selection of the material for the etch stop layer 105 takes into consideration of the etchant chemistry used by the operation 222. For example, etchants having $CF_4$, $Cl_2$, $BCl_3$, $O_2$, and/or $N_2$ do not effectively etch silicon germanium (SiGe), silicon arsenide (SiAs), or silicon phosphide (SiP). Therefore, these materials (SiGe, SiAs, or SiP) may be used for the etch stop layer 105. In addition, these materials may be conveniently grown over the silicon substrate 102, making process integration easier.

Figure 13:
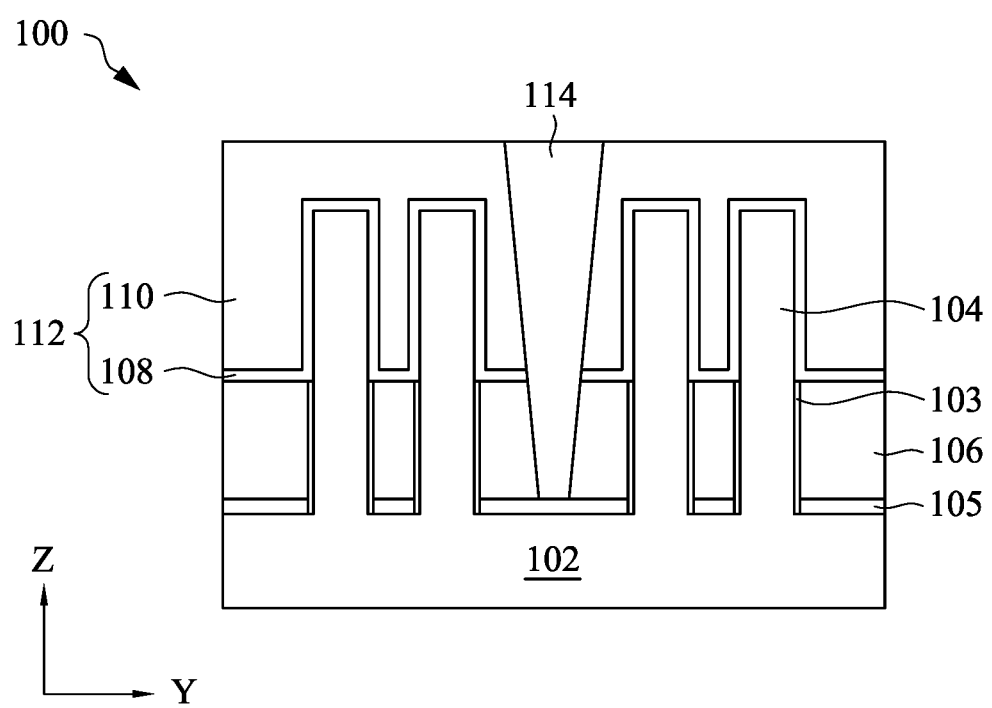

At operation 224, the method 200 (FIG. 2B) fills the CMG trench 113 with one or more dielectric materials to form the dielectric layer 114, such as shown in FIG. 13. Since the sidewalls of the CMG trench 113 contain metallic materials, at least the outer portion of the dielectric layer 114 that is in direct contact with the high-k metal gate stack 112 is free of active chemical components such as oxygen. For example, the outer portion of the dielectric layer 114 may include silicon nitride and is free of oxygen or oxide. The dielectric layer 114 may include some oxide in the inner portion thereof in some embodiments. Alternatively, the dielectric layer 114 may include one uniform layer of silicon nitride and is free of oxide. The dielectric layer 114 may be deposited using CVD, PVD, ALD, or other suitable methods. Subsequently, the operation 224 performs one or more CMP processes to remove excessive dielectric layer 114 outside the CMG trench 113 and the hard mask layer 170. Further, the operation 224 may recess the conductive layer 110 (as well as the dielectric layer 114) to a desired HK MG height. The resulting structure is shown in FIG. 13. Although FIG. 13 illustrates the dielectric layer 114 being in direct contact with the etch stop layer 105, in various embodiments, the dielectric layer 114 may or may not be in direct contact with the etch stop layer 105. For example, the dielectric layer 114 may be separated from the etch stop layer 105 by the isolation structure 106 in some embodiments not shown here.

At operation 226, the method 200 (FIG. 2B) performs further steps to complete the fabrication of the device 100. For example, the method 200 may form contacts and vias electrically connecting the S/D features 162 (FIG. 10A) and the gate stacks 112 and form metal interconnects connecting various transistors to form a complete IC.

Although not intended to be limiting, one or more embodiments of the present disclosure provide many benefits to a semiconductor device and the formation thereof. For example, embodiments of the present disclosure provide an etch stop layer directly above a semiconductor substrate and laterally between semiconductor fins, and provide an isolation structure over the etch stop layer. This etch stop layer protects the semiconductor substrate from an etching process that etches a high-k metal gate structure and has poor etch selectivity between the high-k metal gate structure and the isolation structure. With this etch stop layer, the etching process can be extended to ensure that the high-k metal gate structure is completely etched through without the risk of accidentally etching the semiconductor substrate. Furthermore, formation of this etch stop layer can be easily integrated into existing semiconductor fabrication processes.

In one exemplary aspect, the present disclosure is directed to a device that includes a substrate; semiconductor fins extending from the substrate; an isolation structure over the substrate and laterally between the semiconductor fins; a liner layer between sidewalls of the semiconductor fins and the isolation structure; and an etch stop layer between the substrate and the isolation structure and laterally between the semiconductor fins. The etch stop layer includes a material different that of the isolation structure and the liner layer.

In an embodiment of the device, the etch stop layer includes silicon and one of following: carbon, germanium, a group III element, and a group V element. In another embodiment of the device, the etch stop layer includes alumina ($Al_2O_3$), tungsten carbide (WC), yttrium silicon oxide ($YSiO_x$), or an III-V compound.

In an embodiment, the device further includes a high-k dielectric layer over the isolation structure and over top and sidewalls of the semiconductor fins. In a further embodiment, the device further includes a metal gate over the high-k dielectric layer.

In an embodiment, the device further includes a dielectric feature over the etch stop layer and surrounded by the isolation structure on at least sidewalls of the dielectric feature. In a further embodiment, the dielectric feature physically contacts the etch stop layer.

In an embodiment of the device, the substrate includes silicon; the etch stop layer includes silicon germanium; and the etch stop layer physically contacts the substrate. In another embodiment of the device, the etch stop layer has a thickness of about 1 nm to about 5 nm.

In another exemplary aspect, the present disclosure is directed to a method. The method includes providing a structure having a semiconductor substrate and semiconductor fins protruding from the semiconductor substrate; forming a dielectric liner layer on at least sidewalls of the semiconductor fins; forming an etch stop layer in contact with the semiconductor substrate, and between adjacent semiconductor fins; and forming an isolation structure over the etch stop layer and the dielectric liner layer, and between adjacent semiconductor fins.

In an embodiment, the method further includes forming a high-k/metal gate (HK/MG) stack over the isolation structure and engaging the semiconductor fins; and etching the HK/MG stack to expose the isolation structure, thereby forming a trench. In a further embodiment of the method, the trench exposes the etch stop layer. The method may further include filling the trench with a dielectric material.

In an embodiment of the method, the semiconductor substrate includes silicon; the dielectric liner layer includes silicon nitride; the isolation structure includes silicon oxide; and the etch stop layer includes silicon germanium. In another embodiment of the method wherein the dielectric liner layer is formed in contact with the semiconductor substrate and between adjacent semiconductor fins, the method further includes performing an anisotropic etching process to the dielectric liner layer to thereby expose the semiconductor substrate.

In an embodiment of the method, the forming of the etch stop layer includes an epitaxial growth process. In another embodiment of the method, the forming of the etch stop layer includes depositing a layer including silicon and one of: carbon, germanium, arsenic, and phosphorus.

In yet another exemplary aspect, the present disclosure is directed to a method. The method includes providing a substrate; forming a patterned mask over the substrate; etching the substrate through the patterned mask, thereby forming fins protruding out of the substrate; forming a liner layer over the substrate and sidewalls of the fins, the liner layer including silicon nitride; anisotropically etching the liner layer to expose the substrate, leaving remaining portions of the liner layer over the sidewalls of the fins; after the anisotropically etching of the liner layer, forming a layer of silicon compound over the substrate and between the fins; and forming an isolation structure over the layer of silicon compound and between the fins.

In an embodiment of the method, the forming of the layer of silicon compound includes epitaxially growing one of: silicon carbide, silicon germanium, silicon arsenide, and silicon phosphide. In yet another embodiment of the method, the forming of the layer of silicon compound includes implanting phosphorus or boron into the substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a structure having a semiconductor substrate and semiconductor fins protruding from the semiconductor substrate;
    forming a dielectric liner layer on at least sidewalls of the semiconductor fins;
    after the forming of the dielectric liner layer, forming an etch stop layer in physical contact with the semiconductor substrate, and between adjacent semiconductor fins;
    forming an isolation structure over the etch stop layer and the dielectric liner layer, and between adjacent semiconductor fins; and
    recessing the isolation structure to a position below the semiconductor fins.

2. The method of claim 1, further comprising:
    forming a high-k/metal gate (HK/MG) stack over the isolation structure and engaging the semiconductor fins; and
    etching the HK/MG stack to expose the isolation structure, thereby forming a trench.

3. The method of claim 2, wherein the trench exposes the etch stop layer.

4. The method of claim 2, further comprising:
    filling the trench with a dielectric material.

5. The method of claim 1, wherein:
    the semiconductor substrate includes silicon;
    the dielectric liner layer includes silicon nitride;
    the isolation structure includes silicon oxide; and
    the etch stop layer includes silicon germanium.

6. The method of claim 1, wherein the dielectric liner layer is formed in contact with the semiconductor substrate and between adjacent semiconductor fins, further comprising:
    performing an anisotropic etching process to the dielectric liner layer to thereby expose the semiconductor substrate.

7. The method of claim 1, wherein the forming of the etch stop layer includes an epitaxial growth process.

8. The method of claim 1, wherein the forming of the etch stop layer includes depositing a layer including silicon and one of: carbon, germanium, arsenic, and phosphorus.

9. A method, comprising:
    providing a semiconductor substrate;
    forming a patterned mask over the semiconductor substrate;
    etching the semiconductor substrate through the patterned mask, thereby forming first and second semiconductor fins protruding out of the semiconductor substrate, wherein each of the first and second semiconductor fins has a first sidewall and a second sidewall opposing the first sidewall;
    forming a liner layer over the semiconductor substrate and both the first and second sidewalls of each of the first and second semiconductor fins, the liner layer including Silicon nitride;
    anisotropically etching the liner layer to expose the semiconductor substrate, leaving remaining portions of the liner layer over both the first and second sidewalls of each of the first and second semiconductor fins;
    after the anisotropically etching of the liner layer, forming a layer of silicon compound over the semiconductor substrate and between the first and second semiconductor fins;
    forming an isolation structure over the layer of silicon compound and between the first and second semiconductor fins;
    after the forming of the isolation structure, recessing the isolation structure and the liner layer to expose upper portions of the first and second semiconductor fins; and
    forming a gate stack engaging the upper portions of the first and second semiconductor fins, wherein the liner layer remains over both the first and second sidewalls of each of the first and second semiconductor fins.

10. The method of claim 9, wherein the forming of the layer of silicon compound includes epitaxially growing one of: silicon carbide, silicon germanium, silicon arsenide, and silicon phosphide.

11. The method of claim 9, wherein the forming of the layer of silicon compound includes implanting phosphorus or boron into the substrate.

12. A method, comprising:
    providing a structure having a substrate, fins extending above the substrate, and a dielectric liner on sidewalls of the fins;
    forming a layer of silicon compound over the substrate and between the fins, wherein the layer of silicon compound is in physical contact with the substrate, wherein the dielectric liner and the layer of silicon compound have different materials;

forming an isolation structure over the layer of silicon compound and laterally between the fins, wherein at least a portion of the dielectric liner is sandwiched between and in contact with the fins and the isolation structure;

recessing the isolation structure to expose upper portions of the fins;

forming a gate electrode over the isolation structure and engaging the upper portions of the fins; and etching the gate electrode to expose the isolation structure, thereby forming a trench, wherein the trench exposes the layer of silicon compound.

13. The method of claim 12, wherein the forming of the layer of silicon compound includes depositing a layer including silicon and one of: carbon, germanium, arsenic, and phosphorus.

14. The method of claim 12, wherein the forming of the layer of silicon compound includes epitaxially growing one of: silicon carbide, silicon germanium, silicon arsenide, and silicon phosphide.

15. The method of claim 12, wherein the forming of the layer of silicon compound includes implanting phosphorus or boron into the substrate that includes silicon.

16. The method of claim 12, wherein the providing of the structure includes:

receiving the substrate and the fins;

forming a dielectric layer over the substrate and on the sidewalls of the fins; and etching the dielectric layer to expose the substrate, leaving remaining portions of the dielectric layer on the sidewalls of the fins as the dielectric liner.

17. The method of claim 12, further comprising:

filling the trench with a dielectric material.

18. The method of claim 17, wherein a portion of the dielectric material is in physical contact with the gate electrode, and the portion of the dielectric material is free of oxygen.

19. The method of claim 12, wherein the substrate includes silicon and the layer of silicon compound includes silicon germanium.

20. The method of claim 12, wherein the recessing of the isolation structure also recesses the dielectric liner.

* * * * *